United States Patent [19]
Wong

[11] Patent Number: 6,038,166
[45] Date of Patent: Mar. 14, 2000

[54] HIGH RESOLUTION MULTI-BIT-PER-CELL MEMORY

[75] Inventor: Sau C. Wong, Hillsborough, Calif.

[73] Assignee: Invox Technology, Campbell, Calif.

[21] Appl. No.: 09/053,716

[22] Filed: Apr. 1, 1998

[51] Int. Cl.[7] ................................................. G11C 11/34
[52] U.S. Cl. ............................... 365/185.03; 365/185.21; 365/236
[58] Field of Search ......................... 365/185.03, 185.23, 365/185.19, 191, 236, 168, 185.21

[56] References Cited

U.S. PATENT DOCUMENTS

| | | | |
|---|---|---|---|
| 5,043,940 | 8/1991 | Harari | 365/168 |
| 5,095,344 | 3/1992 | Harari | 357/23.5 |
| 5,163,021 | 11/1992 | Mehrotra et al. | 365/185 |
| 5,172,338 | 12/1992 | Mehrotra et al. | 365/185 |
| 5,218,569 | 6/1993 | Banks | 365/189.01 |
| 5,293,560 | 3/1994 | Harari | 365/185 |
| 5,337,275 | 8/1994 | Garner | 365/189.01 |
| 5,394,362 | 2/1995 | Banks | 365/189.01 |
| 5,434,825 | 7/1995 | Harari | 365/185 |
| 5,508,958 | 4/1996 | Fazio et al. | 365/185.19 |
| 5,539,690 | 7/1996 | Talreja et al. | 365/185.22 |
| 5,541,886 | 7/1996 | Hasbun | 365/230.01 |
| 5,563,828 | 10/1996 | Hasbun et al. | 365/185.33 |
| 5,566,111 | 10/1996 | Choi | 365/185.22 |
| 5,583,812 | 12/1996 | Harari | 365/185.33 |
| 5,594,691 | 1/1997 | Bashir | 365/189.09 |
| 5,638,320 | 6/1997 | Wong et al. | 365/185.03 |
| 5,640,350 | 6/1997 | Iga | 365/186 |
| 5,642,312 | 6/1997 | Harari | 365/185.33 |
| 5,671,388 | 9/1997 | Hasbun | 395/430 |
| 5,721,701 | 2/1998 | Ikebe et al. | 365/185.03 |
| 5,748,533 | 5/1998 | Dunlap et al. | 365/185.19 |
| 5,748,546 | 5/1998 | Bauer et al. | 365/210 |
| 5,751,632 | 5/1998 | Choi et al. | 365/185.03 |
| 5,768,184 | 6/1998 | Hayashi et al. | 365/185.03 |
| 5,768,187 | 6/1998 | Uchino et al. | 365/185.03 |
| 5,801,991 | 9/1998 | Keeney et al. | 365/185.23 |
| 5,818,757 | 10/1998 | So et al. | 365/185.23 |
| 5,828,616 | 10/1998 | Bauer et al. | 365/210 |
| 5,831,900 | 11/1998 | Miyamoto | 365/185.03 |

*Primary Examiner*—David Nelms
*Assistant Examiner*—Gene N. Auduong
*Attorney, Agent, or Firm*—Skjerven,Morrill,Macpherson, Franklin and Friel; David T. Millers

[57] ABSTRACT

A non-volatile, multi-bit-per-cell memory has a read circuit that includes a counter, a row line driver, and a sense circuit. During a read, the driver changes a read signal applied to the control gate of a selected memory cell being read. The counter simultaneously counts cycles of a clock signal. When the sense circuit sense a change in conductivity of the selected memory cell, the count in the counter indicates a multi-bit digital value corresponding to the threshold voltage of the selected memory cell and can be used to generate an output data signal. In one embodiment, the driver includes a digital-to-analog converter that generates the read signal. The converter is coupled to the counter so that a count from the counter controls the voltage of a read signal from the converter. The sense circuit can stop or disable the counter upon sensing a change in conductivity in a selected memory. The count is then output as a multi-bit digital value read from the selected memory cell. In another embodiment, multiple latches are coupled to the counter, and each latch corresponds to one of multiple memory cells that a read operation reads in parallel. As the counter counts, the sense circuit triggers each latch upon sensing a change in conductivity in the corresponding memory cell. The combined outputs from different latches provide multi-bit digital data read from the memory. In still another embodiment, a shift register is coupled to shift and store counts from the counter. An old count that is selected from the shift register to compensate for sensing delay can be used as output data. In yet another embodiment, a control circuit controls a step size and a counting direction for a counter as required in a search for the count corresponding to the threshold voltage of a memory cell.

34 Claims, 10 Drawing Sheets

HIGH RESOLUTION MULTI-BIT-PER-CELL MEMORY

BACKGROUND

Memory cells in many conventional non-volatile semiconductor memories include transistors such as floating gate transistors or split gate transistors that have programmable threshold voltages. The threshold voltage of such a transistor in a memory cell indicates a data value stored in the memory cell and is referred to herein as the threshold voltage of the memory cell. For conventional binary memory, each memory cell stores a single bit of data, and the threshold voltage of each memory cell is in either a region of threshold voltages indicating a bit of value zero or a region of threshold voltages indicating a bit of value one. Multi-bit-per-cell memories store multiple bits of data in each memory cell. To represent multiple bits of data, the range of threshold voltages is split into as many regions as there are possible values that can be stored in an individual memory cell. For example, for a two-bit-per-cell memory, the threshold voltage of each memory cell is in one of four regions that correspond to the possible 2-bit values zero to three which can be stored in the memory cell. For a four-bit-per-cell memory, the range of possible threshold voltages for each memory cell includes sixteen regions corresponding to the possible 4-bit values zero to fifteen.

Multi-bit-per-cell memories have the advantage of storing more information per memory cell and therefore more information per integrated circuit area. Accordingly, multi-bit-per-cell memory can be less expensive to manufacture than conventional binary memory having the same capacity. However, with more bits per memory cell, the reads and writes must have higher precision, and the resolution of write and read circuits limits the amount of information that can be stored per cell. Accordingly, there is a need for precise methods and circuits for writing and reading the threshold voltages that correspond to multi-bit digital values.

Some known multi-bit-per-cell memory use read operations that require a number of reference cells, where each reference cell has a threshold voltage centered between two adjacent regions of threshold voltages permitted for representing data values. When writing data, write reference cells are written to the reference levels. This increases increase write time overhead. During a read, a selected memory cell is simultaneously compared to all of the reference cells, and encoding logic converts the results of the comparisons into a multi-bit digital value. The reference cells, comparators, and encoding logic required for these read operations add considerable complexity to the memory, and the complexity increases exponentially with the number of bits per memory cell. For example, a 2-bit-per-cell memory requires three references and associated comparators, and a 4-bit-per-cell memory requires fifteen references and associated comparators. Additionally, as the number of bits increases, the complexity of the encoding logic, the precision with which the reference cell are written, and the precision of the comparisons of the selected memory cell to each of the references must proportionally increase. Accordingly, as the number of bits per cell increases, making multi-bit-per-cell memory that uses these read techniques becomes difficult or impractical.

In analog semiconductor memory, each memory cell stores an analog value which can be converted to a multi-bit digital value. U.S. Pat. No. 5,638,320, entitled "High Resolution Analog Storage EPROM and Flash EPROM", to Wong et al. and U.S. patent application Ser. No. 08/622,332, entitled "Read Circuit which Uses a Coarse-to-Fine Search when Reading the Threshold Voltage of a Memory Cell", to Dunlap et al. describe analog memories and are incorporated by reference herein in their entity. Such analog memories have high resolution read and write circuits which precisely read and write threshold voltages. The same read and write circuits can be used in multi-bit-per-cell memory, but such use typically requires addition of a digital-to-analog converter (DAC) attached to or in the input or write circuitry of the memory and an analog-to-digital converter (ADC) attached to or in the output or read circuitry of the memory. The addition of such converters, particularly an ADC, can increase integrated circuit complexity and area and slow data access. Adding an ADC is particularly a concern because precision ADCs are typically much more complicated that DACs. Generally, an ADC requires multiple precision analog comparators while a DAC can be constructed with a relatively simple resistor tree. There is a need for effective and efficient circuits and methods that do not require additional converters to read precise threshold voltages that correspond to multi-bit digital values.

SUMMARY

In accordance with the invention, a non-volatile, multi-bit-per-cell memory has a read circuit that includes a counter, a control gate driver, and a sense circuit. During a read, the control gate driver ramps or changes the control gate voltage applied to a memory cell, and the sense circuit senses when the memory cell changes conductivity. The change in conductivity marks the point where the control gate voltage reaches the threshold voltage of the memory cell. Ramping the control gate voltage can be performed in a variety of ways including: starting the control gate voltage at the minimum threshold voltage that corresponds to a stored value and increasing the control gate voltage to the maximum threshold voltage that corresponds to a stored value; decreasing the control gate voltage from the maximum to the minimum threshold voltage; or starting the control gate voltage at an intermediate level and increasing or decreasing the control gate voltage depending on whether the memory cell conducts. The counter starts counting at the beginning of a read operation and continues counting while the ramp circuit changes the control gate voltage. When the sense amplifier sense the change in conductivity, the count in the counter provides a digital value that indicates both the threshold voltage of the cell and a multi-bit digital value read from the cell. Accordingly, an analog-to-digital converter is not required to convert the read signal from an analog voltage level to a multi-bit digital value.

In accordance with another embodiment of the invention, a non-volatile, multi-bit-per-cell memory has control gate driver a that includes a converter coupled to the counter where the converter generates a read voltage matching the count from the counter. During a read, decode circuitry applies the read signal from the converter to the control gate of a selected memory cell, and a clock signal applied to the counter causes the counter to change the count and the read signal. The sense circuit senses the conductivity of a selected memory cell, and from the conductivity identifies a count associated with the threshold voltage of the selected memory cell. A multi-bit portion of a data value read from the memory is either equal to the identified count or can be determined from the identified count.

In one embodiment, the counter starts at an initial value, typically zero, and counts until the sense circuit senses the voltage of the read signal passing the threshold voltage of a memory cell being read. The sense circuit upon detecting a change in conductivity of the memory cell being read, stops or disables counting. If the sense circuit has a sensing time shorter than the period of the clock signal to the counter, the count from the counter can be then output as a multi-bit digital value read from the selected memory cell. If the period of the clock signal is shorter than the sensing time, the count, before being output as part of the value read, can be decreased by an amount that depends on the sensing time.

In another embodiment, one or more latches or registers are coupled to the counter. Each latch or register corresponds to one of multiple memory cells in the same row that a read operation reads. As the counter counts, the row line voltage (i.e., the control gate voltage for all memory cells in the row) changes, and the sense circuit causes each latch or register to record a multi-bit output value upon sensing a change in conductivity of the memory cell corresponding to the latch or register. The counts recorded at different times during the read operation indicate multi-bit portions of the value read from the memory. One embodiment includes shift registers. During each clock cycle, an old count from the counter shifts into the shift registers, and older counts already in the shift registers shift. The sense circuit stops shifting in individual shift registers upon sensing a change in conductivity in the associated memory cell. The depth of the shift registers and values from the shift registers that are output as part of the data value read can be selected according to the sensing time.

In yet another embodiment, the counter is an up/down counter. For a read, a control circuit sets the count in the counter to an initial value which typically corresponds to the middle of the range of threshold voltages for stored data values and selects a direction for counting (up or down) according to whether the selected memory cell conducts at the control gate voltage corresponding to the initial count. Thus, the count need only count through half the range of possible values which cuts the worst case read time in half. The counter can further have a variable step size where the control circuit then controls the step size and counting direction for the counter as required in a search for the count that corresponds to the threshold voltage of a selected memory cell. At each step in the search, the control circuit selects the counting direction for the counter according to whether the sense circuit indicates the selected memory cell conducts at the control gate voltage corresponding to a current count. The counting direction is selected to move the voltage of the read signal in a direction toward the threshold voltage of the selected memory cell. The step size starts large so that the change in the count may cause the read signal to over shoot the threshold voltage of the cell. However, the step size decreases (for example, by half during each clock cycle) to narrow the search and converge on the count corresponding to the threshold voltage of the selected memory cell. The count thus found is output as all or part of a data value being read. Similar overlapping searches can be used to determine at least partially in parallel counts for multiple selected memory cells.

One multi-level memory in accordance with the invention includes an array of memory cells, decode circuitry such as row and column address decoders, and a read circuit. Each row line in the array couples to control gates of memory cells in a row of the array, and each column line couples to memory cells in a column of the array. The read circuit includes a counter, a converter coupled to the counter, and an output circuit coupled to the counter. The converter generates a read signal having a voltage that depends on a count in the counter, and the output circuit generates from the count, a data signal that represents a value read from the array. A sense circuit senses conductivity of a memory cell being read and indicates to the output circuit which value of the count corresponds to the threshold voltage of the memory cells.

One read method in accordance with the invention includes: applying an output signal of a converter to a selected row line in a memory array, the selected row line being connected to control gates of multiple memory cells in a row of the array; applying to the converter a count signal from a counter, wherein the count signal controls the voltage of the output signal; applying a clock signal to the counter to change the count signal; sensing conductivity of a memory cell on a selected column line in the memory array; and generating an output data signal from the count signal.

BRIEF DESCRIPTION OF THE DRAWINGS

Use of the same reference symbols in different figures indicates similar or identical items.

DETAILED DESCRIPTION OF THE PREFERRED EMBODIMENTS

In accordance with the invention, a read circuit for a multi-bit-per-cell memory includes a counter that counts while read voltages are applied to a memory cell. When a sense circuit detects a change in conductivity of the memory cell, the counter provides a digital count signal that indicates the value stored in the memory cell. Accordingly, a read circuit can read a multi-bit digital value without performing an analog-to-digital conversion.

Figure 1:
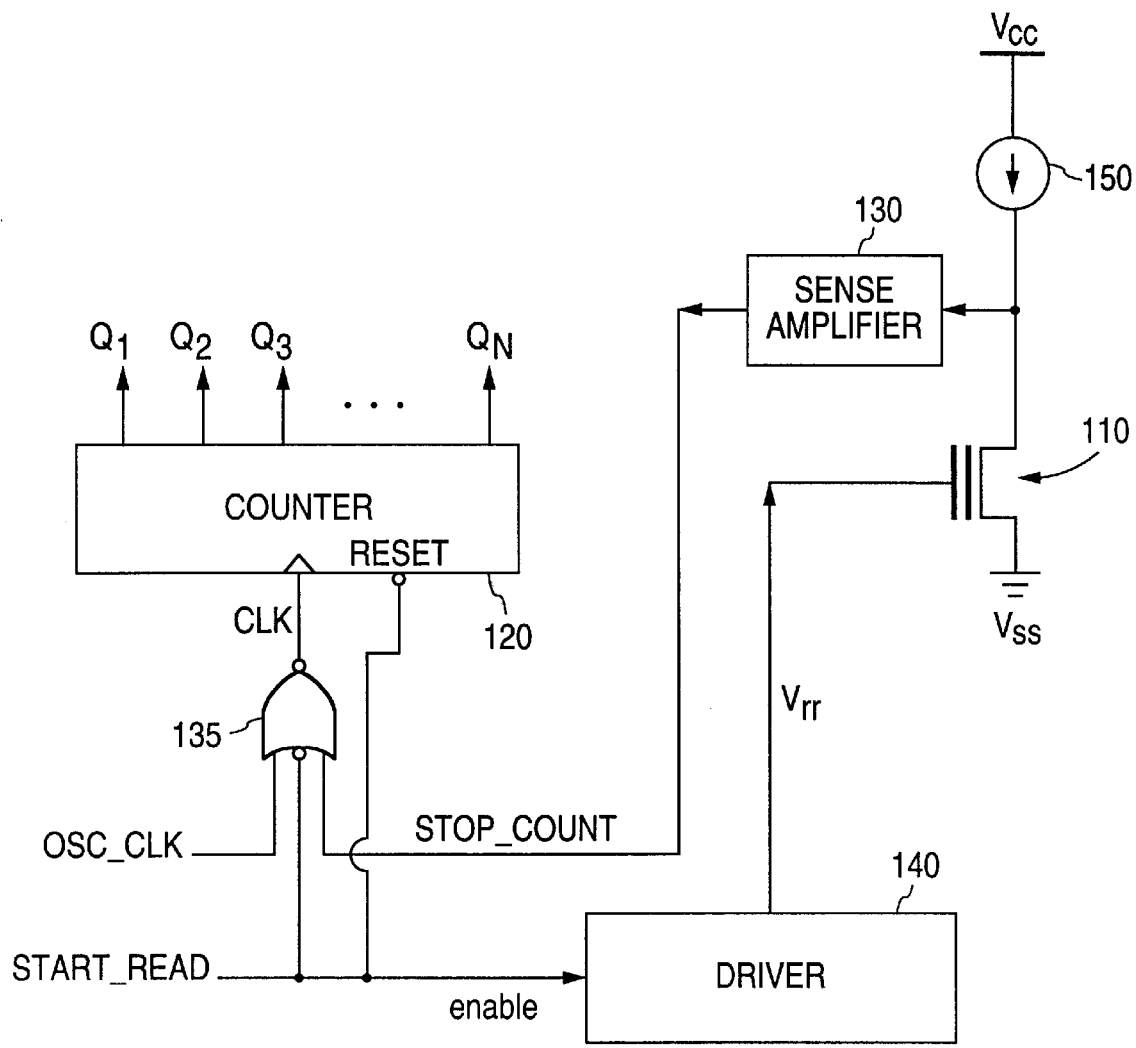
FIG. 1 shows a memory cell and a read circuit that in accordance with an embodiment of the invention reads multiple bits of information from the memory cell.
Figure 2:
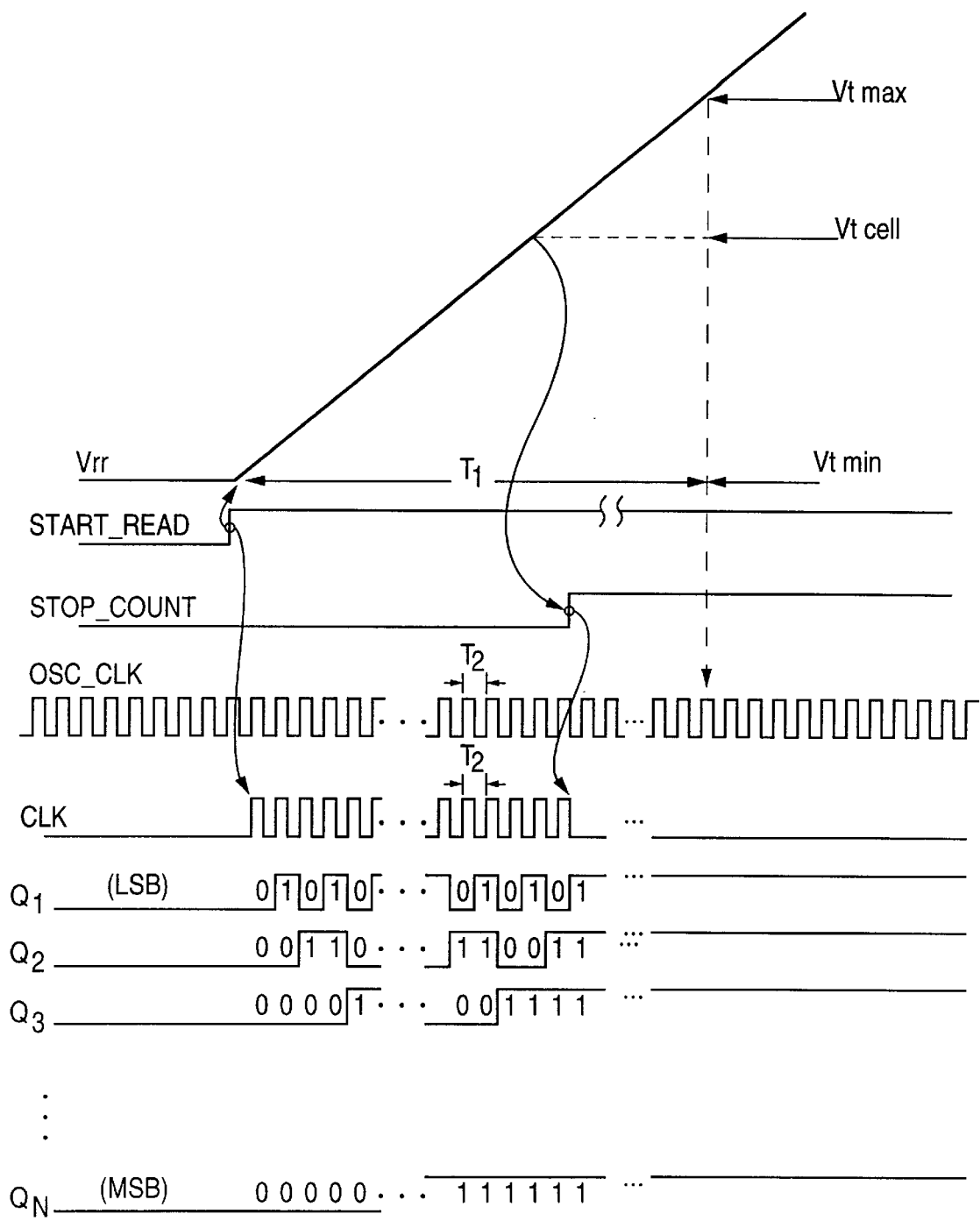
FIG. 2 illustrates signals used in a read process for the circuitry of FIG. 1.

FIG. 1 shows an embodiment of the invention in which a counter 120 counts while a driver circuit 140 and a load 150 respectively control a gate voltage Vrr and a drain voltage of a memory cell 110. A sense circuit including a sense amplifier 130 and a NOR gate 135 control counting of counter 120. FIG. 2, which described in conjunction with FIG. 1, illustrates various signals during reading of memory cell 110. For a read operation, counter 120 is initially set to a starting count. In FIG. 2, signals START_READ and STOP_COUNT are initially low. Signal START_READ being low resets counter 120 so that each of bits Q1 to QN of the count signal from counter 120 is initially zero. Signal START_READ being low also causes a signal CLK from NOR gate 135 to the clock input of counter 120 to remain low. At the start of a read operation, signal START_READ is asserted high and signal CLK begins to toggle with the frequency of a clock signal OSC_CLK. In response, counter 120 begins to count and bits Q1 to QN change accordingly.

Assertion of signal START_READ also enables driver 140, which gradually increases voltage Vrr on the control gate of memory cell 110. Driver 140 may contain, for example, a capacitor and a current source connected to linearly increase voltage Vrr from a voltage Vtmin, which is equal to the minimum threshold voltage corresponding to a stored multi-bit digital value, to a voltage Vtmax, which is equal to the maximum threshold voltage corresponding to a stored multi-bit digital value. Driver 140 is matched with counter 120 and the frequency of signal OSC_CLK so that during the time T1 required for driver 140 to raise signal Vrr from voltage Vtmin to voltage Vtmax, counter 120 exactly counts through the range of possible multi-bit digital values stored in memory cell 110. Signal START_READ synchronizes starting of counter 120 and driver 140.

During the read, memory cell 110 is connected in series with a load 150 between a supply voltage Vcc and ground. Sense amplifier 130, which is connected to the drain of memory cell 110, senses the conductivity of memory cell. While signal Vrr is less than the threshold voltage Vtcell of memory cell 110, sense amplifier 130 keeps signal STOP_COUNT low, and counter 120 continues counting. Once signal Vrr is above threshold voltage Vtcell, memory cell 110 conducts, and sense amplifier 130 asserts signal STOP_COUNT high. NOR gate 135 then drives signal CLK low which stops counter 120 from further counting and keeps signals Q1 to QN constant. Provide that driver 140 and counter 120 are suitably synchronized and matched and the sensing time is short relative to the clock cycle time, bits Q1 to QN accurately indicate the voltage level of Vrr when memory cell 110 begins to conduct and therefore also indicates the threshold voltage Vtcell or a stored value of memory cell 110.

Some or all of bits Q1 to QN provide a digital output signal representing a multi-bit digital value read from memory cell 110. For example, for 2-bit-per-cell memory storage, bits Q(N−1) and Q(N) become the output data. 4-bit-per-cell memory requires bits Q(N−3), Q(N−2), Q(N−1), and QN. Outputting more of bits Q1 to QN provides more data bits per cell and increase storage density. In general, the data integrity is inversely proportional to the number of storage levels per cell because more storage levels in the range Vtmin to Vtmax requires a smaller threshold voltage window for each level. Providing programmable or hardwire options on-chip for selection of number of bits Q1 to QN output during a read gives an integrated circuit (IC) memory a selectable storage density and reliability. This capability adds flexibility during evaluation, characterization, and reliability tests of IC memory. For example, the storage density of a specific IC can be selected according to the reliability requirement of that IC as determined during testing. Additionally, an end user might benefit from being able to select among maximum storage density (N bits per cell) with less data integrity, a standard bit storage density (N−1 bits per cell), or lower bit density (N−2 bits per cell) with higher reliability. The storage density of a specific IC can be selected according to the reliability requirement of the targeted end application.

The worst case access time for the read operation illustrated in FIG. 2 depends on the counter size and the period T2 of clock signal OSC_CLK. More specifically in the worst case (when threshold voltage Vtcell is equal to maximum threshold voltage Vtmax), counter 120 must count through the entire range of possible values and voltage Vrr must rise to level Vtmax before sense amplifier detects a change in conductivity of memory cell 110. Table 1 shows for different access times how the counter clock frequency controls the maximum count and the maximum number of bits which can be read from a single memory cell.

TABLE 1

Read Access Times for Different Read Circuit Configurations

| Read Access Time T1 | Counter Clock Period (Frequency) | Maximum Count | Equivalent Number of Bits per Cell |
|---|---|---|---|
| 100 µs | 1 µs (1 MHz) | 100 | 6 |
| 100 µs | 333 ns (3 MHz) | 300 | 8 |
| 100 µs | 67 ns (15 MHz) | 1,500 | 10 |
| 100 µs | 20 ns (50 MHz) | 5,000 | 12 |
| 100 µs | 10 ns (100 MHz) | 10,000 | 13 |
| 1 µs | 100 ns (10 MHz) | 10 | 3 |
| 1 µs | 50 ns (20 MHz) | 20 | 4 |
| 1 µs | 20 ns (50 MHz) | 50 | 5 |
| 1 µs | 10 ns (100 MHz) | 100 | 6 |
| 100 ns | 20 ns (50 MHz) | 5 | 2 |
| 100 ns | 10 ns (100 MHz) | 10 | 3 |
| 100 ns | 5 ns (200 MHz) | 20 | 4 |

As shown in Table 1, the maximum count and the number of levels per cell are not required to be a power of 2. However, restricting each memory cell to a specific number of bits is generally most useful for binary system. Applications such as audio playback which afford relatively slow read access times of 100 µs or longer have up to thirteen times the density of conventional binary memory at clock frequencies that are common for current integrated circuits. Even for access times faster than 100 ns, which is typical for program or data storage applications, a four-fold increase in storage density is achievable at a clock frequency of 200 MHz.

Figure 3:
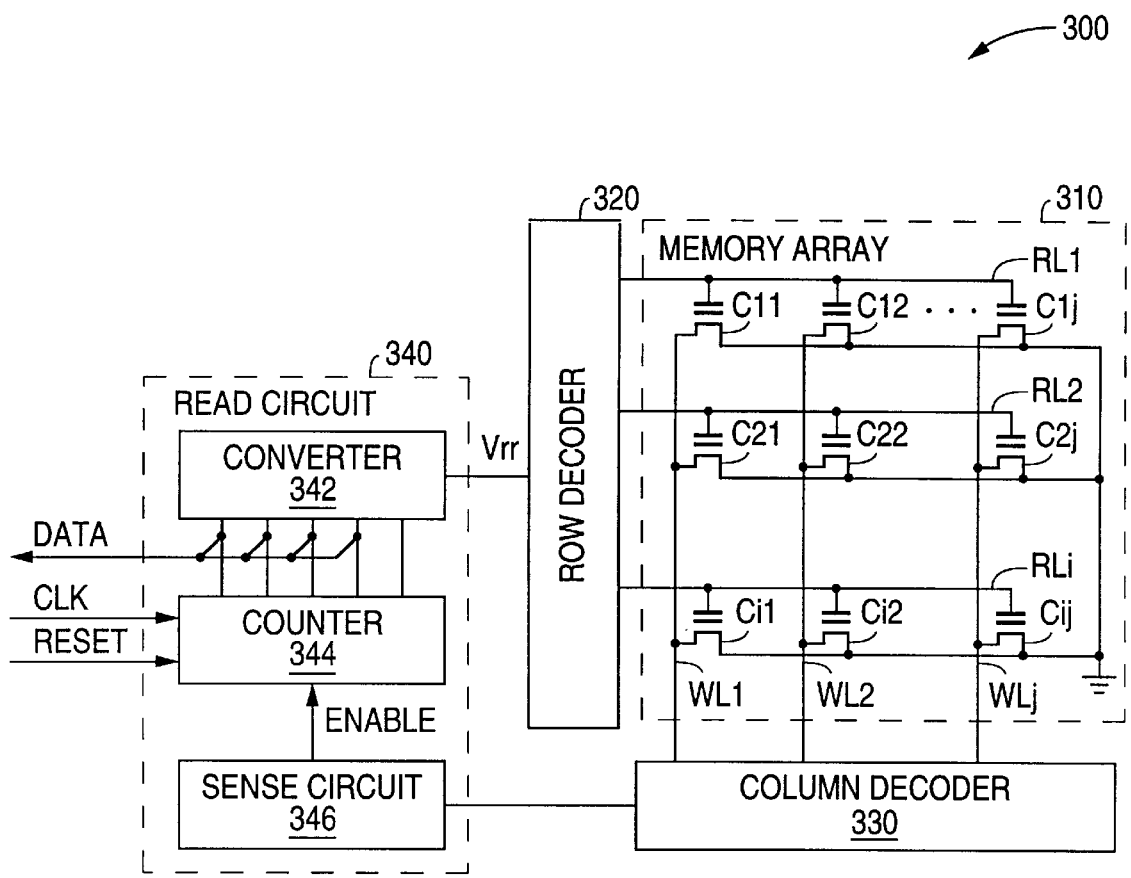
FIG. 3 shows a multi-level memory that in accordance with an embodiment of the invention, includes a counter that controls a gate voltage and provides a multi-bit digital value when reading a memory cell.

One way to synchronize control gate voltage Vrr with a count from a counter is to use the count from a counter 342 to control the control gate voltage Vrr. FIG. 3 shows a portion of a multi-level memory 300 that employs this aspect of the invention. Memory 300 contains an array 310 of i rows and j columns of memory cells C11 to Cij which a row decoder 320 and a column decoder 330 connect to a read circuit 340 during a read. Write circuitry, which is not show in FIG. 3, can be implemented in as known in the art. In array 310, memory cells C11 to Cij are single transistor memory cells (e.g., floating gate transistors), each having an accessible gate and a threshold voltage which indicates a stored value. Alternative embodiments of the invention employ multiple-transistor memory cells which have separate select gates (not shown) and control gates. Rows of memory cells C11 ... C1j to Ci1 ... Cij have control gates coupled to respective row lines RL1 to RLi. Columns of memory cells C11 ... Ci1 to C1j ... Cij have drains coupled to respective column lines CL1 to CLj. In FIG. 3, a single source line SL connects the sources of memory cell C11 to Cij to ground. Alternatively, memory cells C11 to Cij can be divided into multiple sectors, where each sector has a source line that is coupled to a source decoder. The source decoder controls the voltages on the source lines. Such non-volatile memory architectures are well known for flash memories.

In memory 300, each of memory cells C11 to Cij has a threshold voltage that represents a stored 4-bit data value. For illustration, it is assumed that the 4-bit values from 0 to 15 are linearly mapped to target threshold voltages in a range from 2 volts (Vtmin) to 5 volts (Vtmax). However, many suitable mappings from threshold voltages to stored values are possible. Generally, the range of threshold voltages for representing stored values depends on the capabilities of the memory cells, read circuits, and write circuits and therefore on memory structure. The number of possible stored values per memory cell depends on the resolution for reading and writing threshold voltages of memory cells and expected disturbances of threshold voltages during operation of the memory. Additionally, the mapping between the stored values and threshold voltage can be any linear or non-linear function, including functions mapping a value zero to the highest or lowest or mid-level threshold voltages.

During a read, row decoder 320 and column decoder 330 respectively connect a selected one of row lines RL1 to RLi and a selected one of column lines CL1 to CLj to read circuit 340. Row and column decoders are well known in the art and for example, may include driver circuits and transistor trees having input row and column address signals. During a read, row decoder 320 applies a read signal Vrr from read circuit 340 to the row line selected by the row address signal and grounds the other row lines. Column decoder 330 applies a read voltage Vrc (typical about 1 volt) to a column line selected by the address signal and grounds the other column lines. Column decoder 330 also connects read circuit 340 to the selected column line.

Figure 4A:
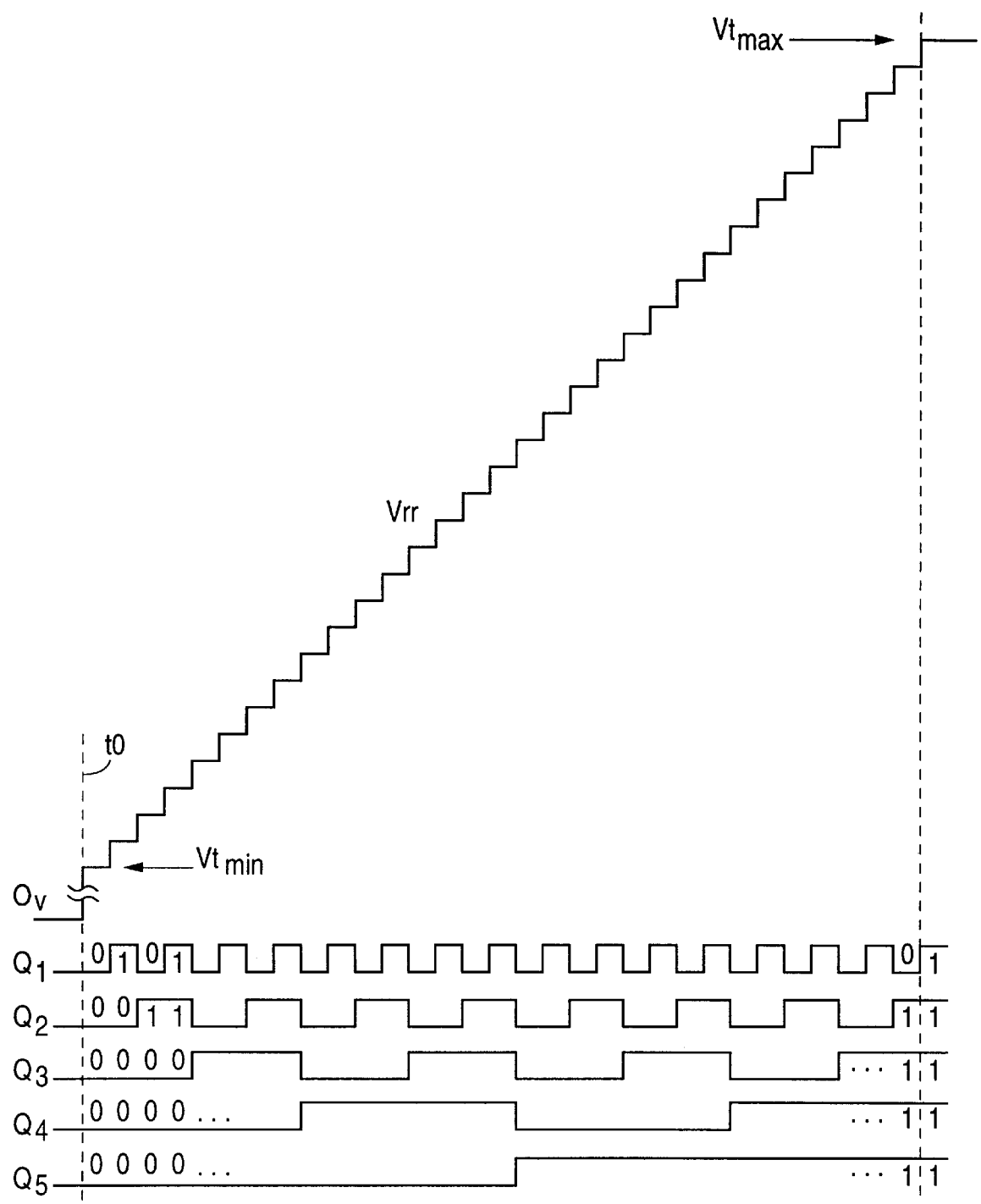
FIGS. 4A and 4B illustrate signals used in read processes for the circuitry of FIG. 3.

Read circuit 340 includes a converter 342, a counter 344, and a sense circuit 346. During a read, converter 342 generates read signal Vrr at a voltage level that is determined from the count in counter 344. FIG. 4A illustrates the relation between read signal Vrr and count bits Q1 to Q5 during one read process for memory 300. Before a read begins, the selected word line is grounded, and read signal Vrr is at 0 volts. At time t0, read control circuitry (not shown) then resets the count in counter 344 to an initial count, and charges signal Vrr to the threshold voltage that corresponds to the initial count. In FIG. 4A, the initial count is zero, and signal Vrr initially charges to the minimum threshold voltage level Vtmin. If the memory cell initially conducts, the value stored in the memory cell is zero (i.e., four zero bits) stored in a memory cell, and four bits Q2 to Q5 can be immediately output as the value read from the selected memory cell. Otherwise, counter 344 increments the count in response to a clock signal CLK, and converter 342 responds to the increasing count by increasing the voltage of read signal Vrr. For a zero count, converter 342 generates an output voltage that is less than the minimum threshold voltage corresponding to a stored one. For maximum count, converter 342 generates an output voltage that is greater than the maximum threshold voltage corresponding to any stored value. For the exemplary embodiment, converter 342 can include a conventional digital-to-analog converter combined with a voltage shifter that linearly map counts to voltages of signal Vrr. For other mappings of threshold voltages to data values, converter 342 generates signal Vrr at the voltages about equal to upper limit of the threshold voltages corresponding to a data value that is equal to the four most significant bits of the count.

In memory 300, counter 344 is a 5-bit counter, and incrementing the count in counter 344 increases the voltage of signal Vrr by less than the difference between the target threshold voltages for consecutive data values. However, the four most significant bits of the count identify the largest data value having a threshold voltage less than voltage of signal Vrr output from converter 342. Alternatively, any counter containing at least as many bits as are stored in a single memory cell (e.g., at least four bits for the exemplary embodiment of memory 300) can be used instead of counter 344. An advantage of larger counters is better accuracy or resolution in the voltage of signal Vrr. Row decoder 320 applies the output signal Vrr from converter 342 to the row line connected to selected memory cells to be read, and a smoother increase in voltage Vrr allows the voltages to settle faster on the selected row line. However, at a fixed clock frequency for signal CLK, a smaller counter provides a faster read process as described below.

As counter 344 counts, read signal Vrr increases in voltage as shown in FIG. 4A. When read signal Vrr first exceeds the threshold voltage of the selected memory cell, the selected memory cell begins to conduct. Sense circuit 346 senses that the selected memory cell conducts and disables counter 344 or otherwise stops counter 344 from further incrementing the count. In one embodiment, sense circuit 346 includes a binary sense amplifier that asserts an output signal when a current or change in voltage on the selected column line indicates a memory cell connected to the selected column line conducts. FIG. 4A shows the worst case read where counter 344 counts up to the maximum count (11111b), and signal Vrr reaches the threshold voltage level Vtmax for the largest stored value. More generally, the maximum number of clock cycles required for counter 344 to count up to the count corresponding to the threshold voltage read is about $2^N$ where N is the number of bits in counter 344. The average access time is about half the worst case.

Figure 4B:
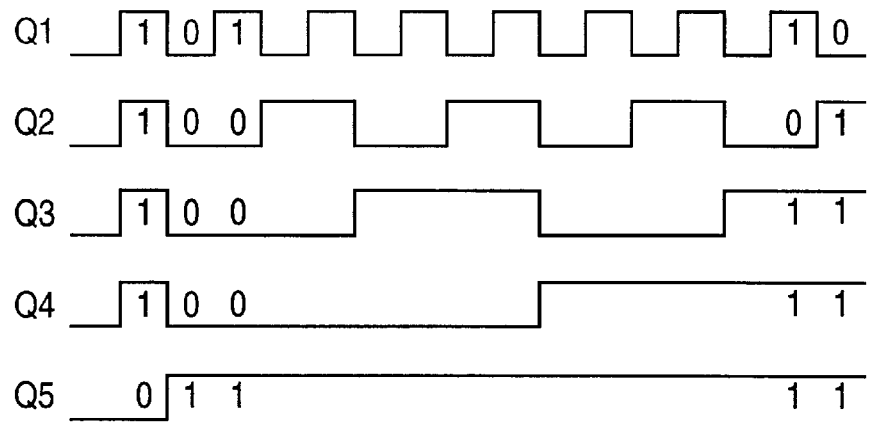
Figure 4B:
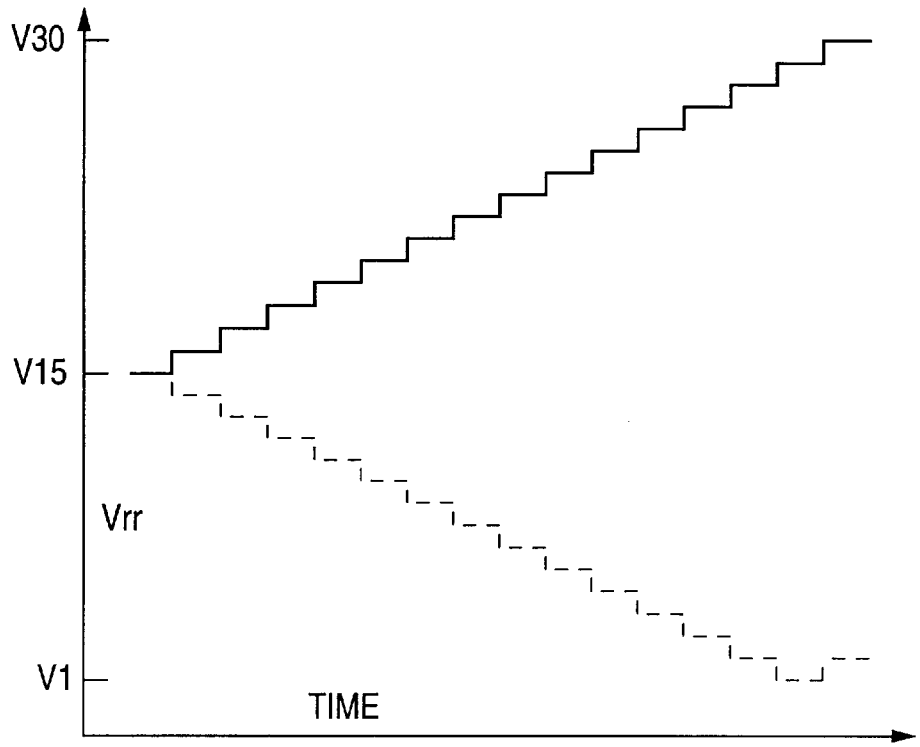
Figure 4B:
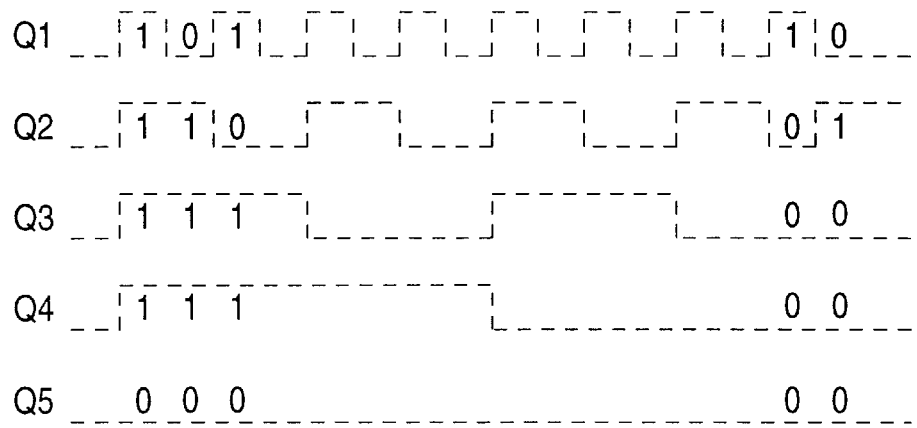

In an alternative embodiment counter 344 is an up/down counter which at the start of a read operation, is initialized to a non-zero count, for example in the middle of the counting range. FIG. 4B illustrates read operations using an up/down counter 344. For the read operations of FIG. 4B, counter 344 is initially (at time t0) set to count 15 and signal Vrr is at a voltage V15 corresponding to count 15. Voltage V15 is also just greater than the maximum threshold voltage for a memory cell storing a value seven in the memory cell. Sense circuit 346 then sense whether the selected memory cell conducts and selects a counting direction for counter 344. Signal CLK is then started, and counter 344 counts (i.e., increments or decrements the count) until the conductivity of the selected memory cell changes. An advantage of starting in the middle of the counting range is that the worst case read requires about one half the number of clock cycles as the method of FIG. 4A.

If the selected cell does not conduct at time t0, the threshold voltage of the selected memory cell is greater than V15, and counter 344 counts up to increase the voltage of signal Vrr. Solid lines in FIG. 4B represent signal Vrr and count bits Q1 to Q5 during a worst case read when counter 344 counts up. Generally, counting up continues until signal Vrr reaches the threshold voltage of the selected memory cell and the selected memory cell begins to conduct. At that point, count bits Q2 to Q5 are output as the 4-bit data value read from the selected select cell. However, if the count reaches 30 (i.e., 11110b), the value stored in the memory cell must be 15, and count bits Q2 to Q5 can be output regardless of whether the memory cell conducts. Accordingly, in the worst case for counting up, counter 344 counts from 15 to 30, which requires 15 clock cycles.

If the selected cell conducts at time t0, the threshold voltage of the selected memory cell is less than V15, and counter 344 counts down to decrease the voltage of signal Vrr. Dashed lines in FIG. 4B represent signal Vrr and count bits Q1 to Q5 during a worst case when counter 344 counts down. For counting down, sense circuit 346 sense a change from the conducting state of the selected memory cell to the non-conducting state. At this point, the count in counter 344 is one less than the count corresponding to the threshold voltage of the memory cell. Accordingly, before reading out bits Q2 to Q5 as the value read, the count can be incremented. However, if the count reaches 1 (i.e., 00001b) and the selected memory cell still conducts, the selected memory cell must be storing the value zero, and count bits Q2 to Q5 can be immediately output as the value read. In the worst case, the selected memory cell stores the value 1 and has a threshold voltage that is greater than a voltage V1 corresponding to count 1 but less than a voltage V2 corresponding to count 2. Accordingly, the selected memory cell conducts when signal Vrr equals voltage V2 but does not conduct when signal Vrr reaches voltage V1. When count reaches 00001b and the selected memory cell stops conducting, the count in counter 344 is incremented once to 00010b before count bits Q2 to Q5 are output. The worst case read access time for counting down counts from 15 to 1 and then from 1 to 2 and thus requires 15 clock cycles.

Figure 5:
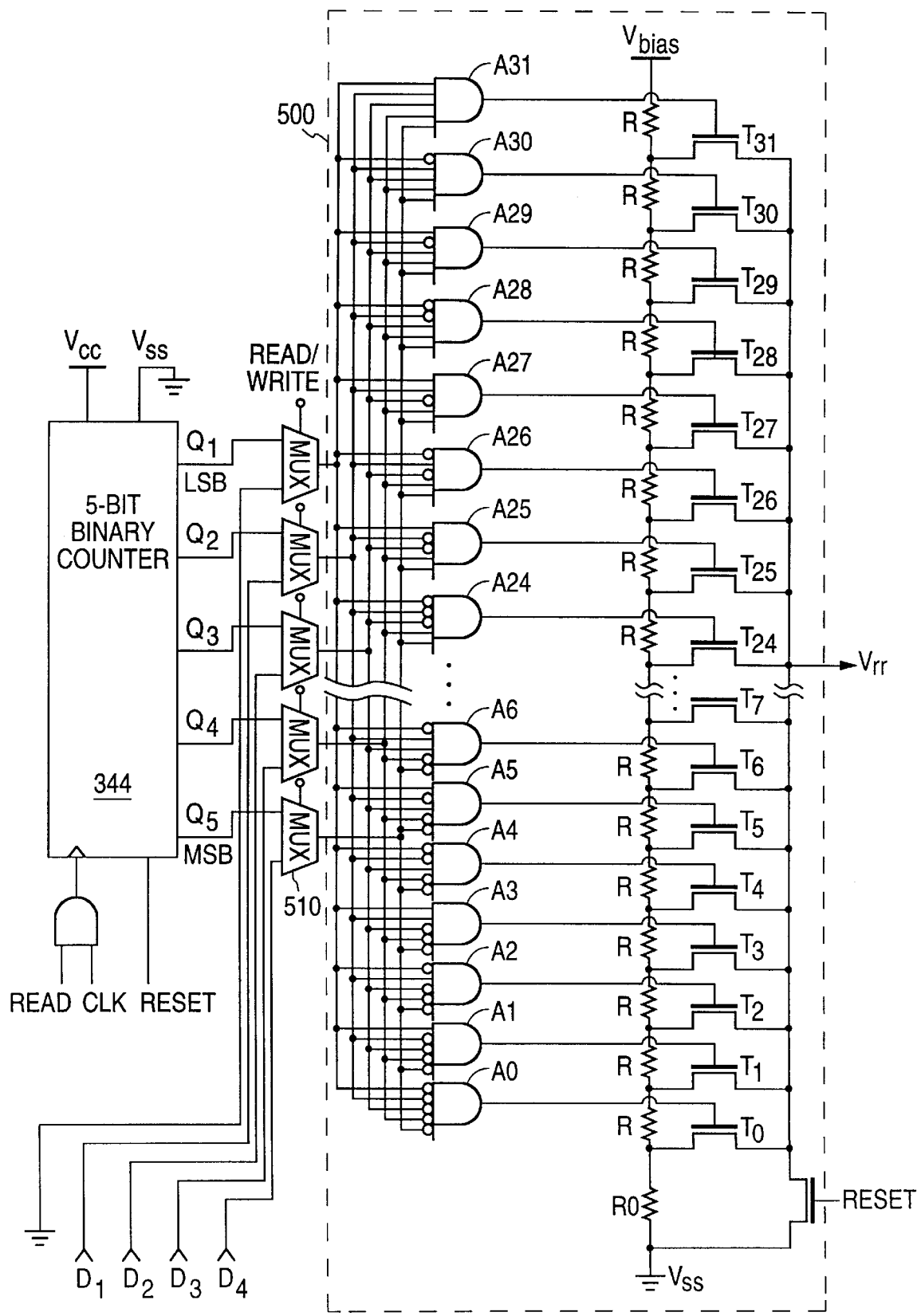
FIG. 5 is a schematic diagram of a converter that in accordance with an embodiment of the invention is coupled to a counter for a read process and to an input port for a write process.

FIG. 5 shows a converter 500 which is one of many possible embodiments for converter 342 of FIG. 3. Converter 500 includes a resistor R0, resistors R, transistors T0 to T31, and AND gates A0 to A31. Resistors R and resistor R0 are connected in series between a bias voltage Vbais and a reference voltage Vss (ground). The resistances of resistors R and resistor R0 are selected so that during a read, the voltage drop across resistor R0 is equal to the minimum threshold voltage Vtmin representing a stored value and the voltage drop across each resistor R is about equal to the difference between voltages Vbias and Vtmax. Transistors T0 to T31 connect taps that are between resistors R and R0 to an output terminal for signal Vrr. To select the voltage level of signal Vrr, AND gates T0 to T31, which are connect to the respective gates of transistors T0 to T31, turn on a single one transistors T0 to T31 that corresponds to an input digital signal. Converter 500 connects to counter 344 via multiplexers 510 which allow converter 500 to be used both during read operations described above and during write operations as described further below. During a read, multiplexers 510 connects a unique combination of count bits Q1 to Q5 and their complements to each of AND gates A0 to A31 so that count bits Q1 to Q5 control which of transistors T0 to T31 is on.

According to an aspect of the invention converter 500 can be used for both reading and writing multi-bit digital values. During an exemplary write process, multiplexers 510 connect four data bits D1 to D4 to AND gates T0 to T31 in place of count bits Q2 to Q5. Data bits D1 to D4, which represent a 4-bit value to be written, thus control the voltage (signal Vrr) applied to a selected row line during a write. One write operation includes a series of programming operations that increase the threshold voltage of a selected memory cell and a series of verify operations that determine whether the threshold voltage of the selected memory cell has reached the target level. A verify operation follows each programming operation. During a programming operation, the voltage of signal Vbias is increased so that converter 500 applies a relatively high voltage Vrr, e.g., 8–12 volts, to a selected control gate. The programming operation further grounds source lines and applies a signal Vw at an intermediate voltage, e.g., 5–6 volts, to the selected column line or the drain of the selected memory cell. This combination of voltages causes channel hot electron injection during programming operations and increases the threshold voltage of the selected memory cell. For programming operations, signal Vrr, which is appled to the selected row line, linearly depends on the value being written D1 to D4. This provides more uniform control for writing higher or lower threshold voltages.

For a verify operation, the voltage of signals Vbias is reduced, and the sense circuit senses whether the selected memory cell conducts. The selected memory cell does not conduct if the threshold voltage of the selected memory cell is greater than the voltage of signal Vrr. The series of programming operations is stopped when the sense circuit senses that the selected memory cell does not conduct during a verify operation. Thus, the threshold voltage written to a memory cell is about equal to the voltage of signal Vrr which depends on data bits D1 to D4 and the level of signal Vbias during the verify operations. Typically, verify operations lower signal Vbias to the same voltage used for a read operation, but signal Vbias may have a voltage during verify operations that differs from the voltage used during a read. For example, if signal Vbias is at a somewhat lower voltage during verify operations, the selected memory cell will conduct during a read operation when count bits Q2 to QN are equal to the data bits D1 to D4 written. Using the resistor tree for programming, verify, and read operations greatly reduces circuit complexity and silicon area.

Figure 6:
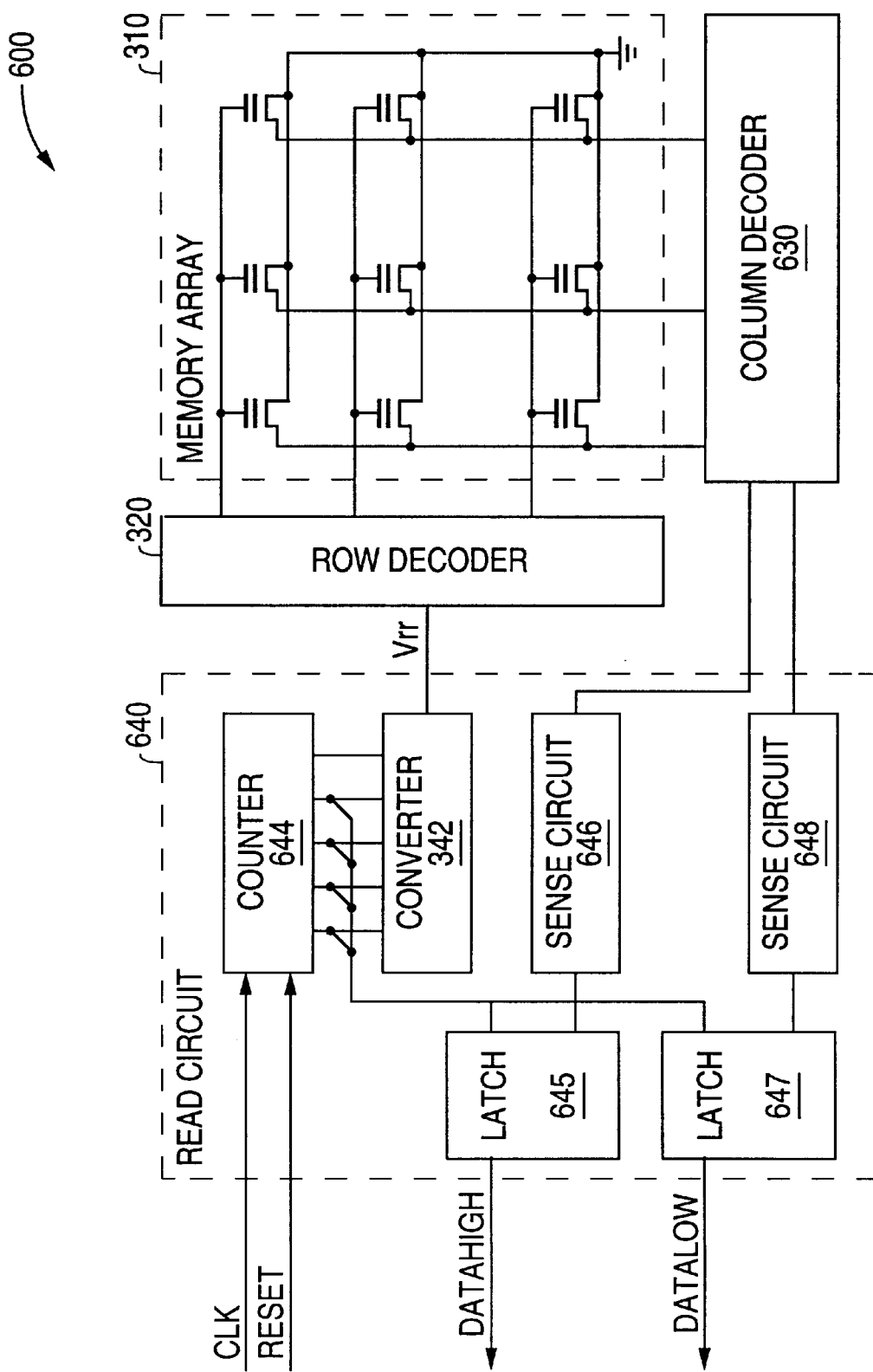
FIG. 6 shows a multi-level memory in accordance with an embodiment of the invention wherein multiple latches are coupled to a counter that controls a gate voltage when reading a memory cell.

FIG. 6 illustrates a portion of a multi-bit-per-cell memory 600 that reads data from two memory cells in parallel. Memory 600 includes an array 310 of memory cells, a row decoder 320, a column decoder 630, and a read circuit 640. Array 310 and row decoder 320 are as described above in regard to memory 300 of FIG. 3. In particular, in the exemplary embodiment, each memory cell in memory array 310 stores a 4-bit data value. To read in parallel multiple memory cells which are connected to the same row line, column decoder 630 applies the read voltage Vrc to multiple column lines selected by an address signal and grounds the other column lines. Column decoder 630 also connects read circuit 640 to the selected column lines. Specifically, column decoder 630 applies read voltage Vrc to two selected column lines simultaneously and connects read circuit 640 to both selected column lines for reading of an 8-bit value (i.e., two 4-bit values) from memory array 310. More generally for a parallel read operation the number of selected column lines depends on the number of bits stored in each memory cell and the desired number of bits to be read during a read operation. The ability to read multiple memory cells with multi-bit-per-cell storage substantially increases the bandwidth of the memory device.

Read circuit 640 includes a counter 644, a converter 342, 4-bit latches 645 and 647, and sense circuits 646 and 648. Each of sense circuits 646 and 648 senses whether a corresponding selected memory cell connected to the sense circuit through column decoder 630 conducts while voltage Vrr is applied to the row line common to the selected memory cells. If the selected memory cell connected to sense circuit 646 conducts, sense circuit 646 asserts a signal that places latch 645 in a latched state. Latch 645 in the latched state holds an output signal DATAHIGH equal to the values that the four most significant bits from counter 644 had when latch 645 transitioned from a transparent state to the latched state. Similarly, if the selected memory cell connected to sense circuit 648 conducts, sense circuit 648 asserts a signal that places latch 647 in a latched state causing latch 647 to hold an output signal DATALOW equal to the values that the four most significant count bits had when latch 647 transitioned from a transparent state to the latched state. Accordingly, during a read, each of sense circuits 646 and 648 independently causes the associated latch 645 or 647 to latch four bits from the count when signal Vrr has reached the threshold voltage of the selected memory cell connected to the sense circuit.

As described above, memory 600 initializes counter 644 to zero for a read operation and steadily increases the count in counter 644 and the voltage of the read signal Vrr which is applied to the selected row line during the read operation. Alternatively, counter 644 can be initialized to a maximum count value, and the count and the voltage level of signal Vrr are steadily decreased during a read. With this alternative read method, when the corresponding selected memory cells stop conducting, sense circuits 646 and 648 assert the signals to put respective latches 645 and 647 in the latched state.

Output signal DATAHIGH and DATALOW are respectively the four most significant and the four least significant bits an 8-bit value read from memory 600. Other embodiments using one or more latches include one or more sense circuit where each sense circuit is coupled to an associated latch. For example, if each memory cell stores N bits of data and a read outputs an M-bit data signal, M/N sense circuits with associated latches or other temporary storage coupled to a counter can provide the M-bit data signal. The time required to complete a read operation depends on the count required to increase the voltage level of signal Vrr to the highest threshold voltage of memory cells being read. A worst case read requires about $2^{N+I}$ clock cycles of clock signal applied to the counter, where I is the difference between the number of bits in the counter and the number of bits in a data value stored in a single memory cell. For example, in the time required for the count in counter 644 to reach 30 (11110 binary), memory 600 can complete a parallel read operation of as many selected memory cell as there are latches. A fixed read time which is greater than or equal to the worst case time can be allocated for each read. Alternatively, a read control circuit can end a read operation when all of the data output latches are in the latched state. In this case, the read access time depends on the values being read. Instead of latches 645 and 647, other storage devices such as flip-flops, registers, or SRAM or DRAM cells can be used to record 4-bit counts from counter 644 when each of the selected memory cells begins conducting.

Figure 7:
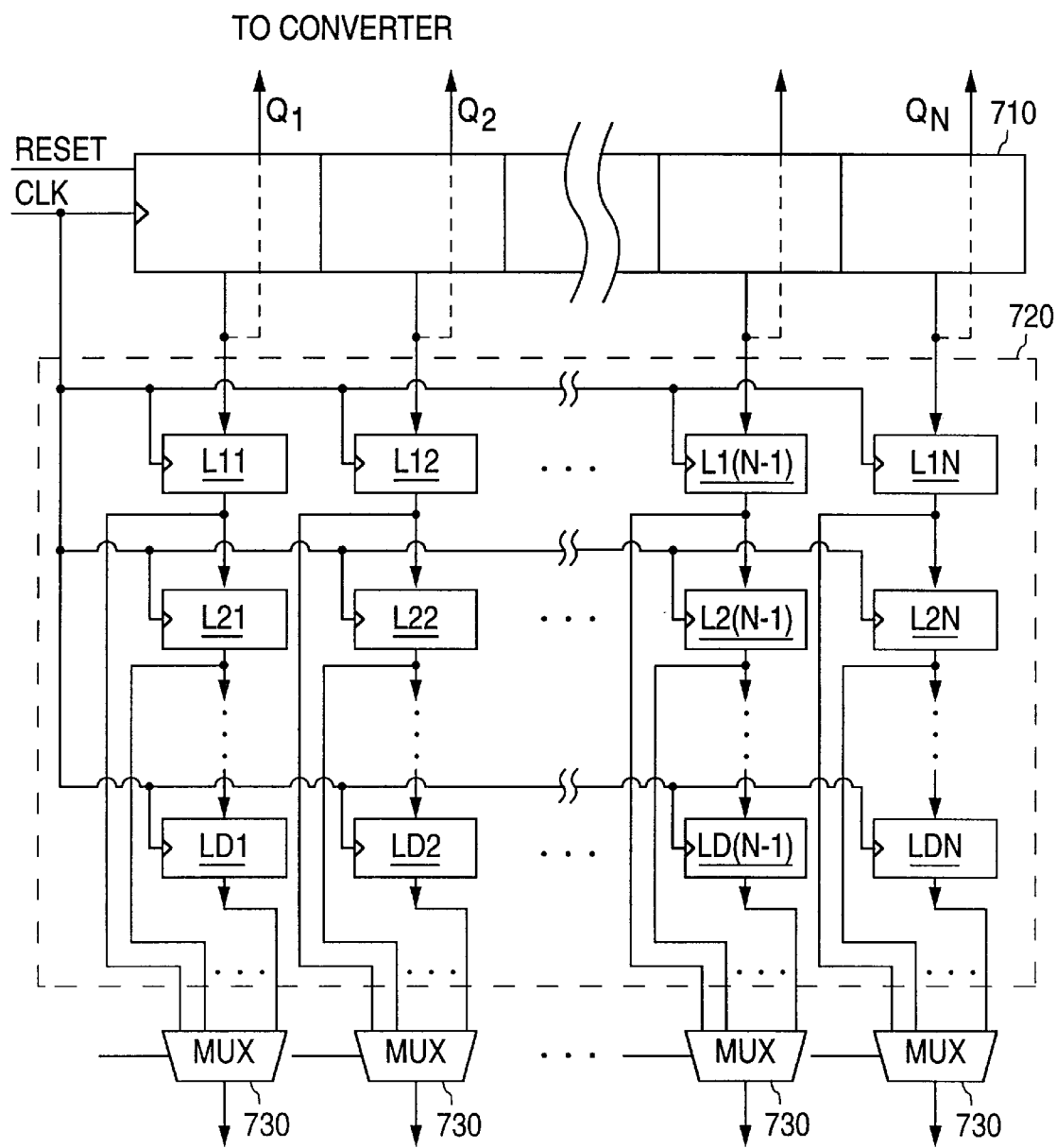
FIG. 7 shows a multi-level memory in accordance with an embodiment of the invention wherein a shift register is coupled to a counter that controls a gate voltage when reading a memory cell.

FIG. 7 illustrates an embodiment of the invention where a shift register 720 records counts from a multi-bit counter 710. Counter 710 is also connected to a converter such as converter 342 in a read circuit for read operations such as described above. Shift register 720 has a width N equal to the number of bits read from each memory cell and a depth D selected according to an anticipated sense circuit delay. FIG. 7 show an embodiment of shift register 720 that includes an N column by D row array of latches or flip-flops L11 to LDN. Multiplexers 730 are connected to the array to select one of the rows as a source of an output data signal. Use of a shift register in a read circuit described above can reduce read access time by accommodating higher counter clock frequencies. In particular, increasing the counter clock frequency for a fixed counter size decreases the time required for the counter to count to a level corresponding to a stored data value and therefore provides a faster read access. However, if the clock period becomes comparable to or shorter than the time required to sense a change in the conductivity of a selected memory cell, the counter may count past the count corresponding to the value being read.

With current memory and sense amplifier technology, the sense circuit delay due, for example, to the count-to-voltage conversion, signal propagation through the row decoder, charging or discharging of the selected row line, the selected cell causing an effect on the bit line, and a sense amplifier sensing the effect can amount to a few to tens of nanoseconds. This limits the maximum counter clock frequency to about 100 to 300 MHz if the sense circuit must sense a change in conductivity within a clock cycle.

With shift register 720, the clock period of the counter clock can be less than the sense circuit delay. For a read, shift register 720 latches a new multi-bit count from counter 710 and shifts older counts within shift register 720 every clock cycle. When signal Vrr reaches the threshold voltage of a memory cell being read, the count from counter 710 shifts into shift register 720, but the sense circuit does not immediately sense a change in conductivity. One or several cycles of signal CLK may occur before the sense circuit senses the change in conductivity of the selected memory cell. When the change is sensed, the sense circuit stops either counter 710 or shifting in shift register 720. At this point, multiplexers 730, based on knowledge of the sense circuit delay, select from shift register 720 one of the counts. The knowledge of the delay can be determined, for example, by simulation or characterization of the memory, by measurements during testing of the circuit, or by a circuit that actively determines the delay. Accordingly, with a shift register of depth 2, 3, or more permits counter clock frequencies which are twice or three or more times faster, and read access times are proportionally decreased.

Figure 8:
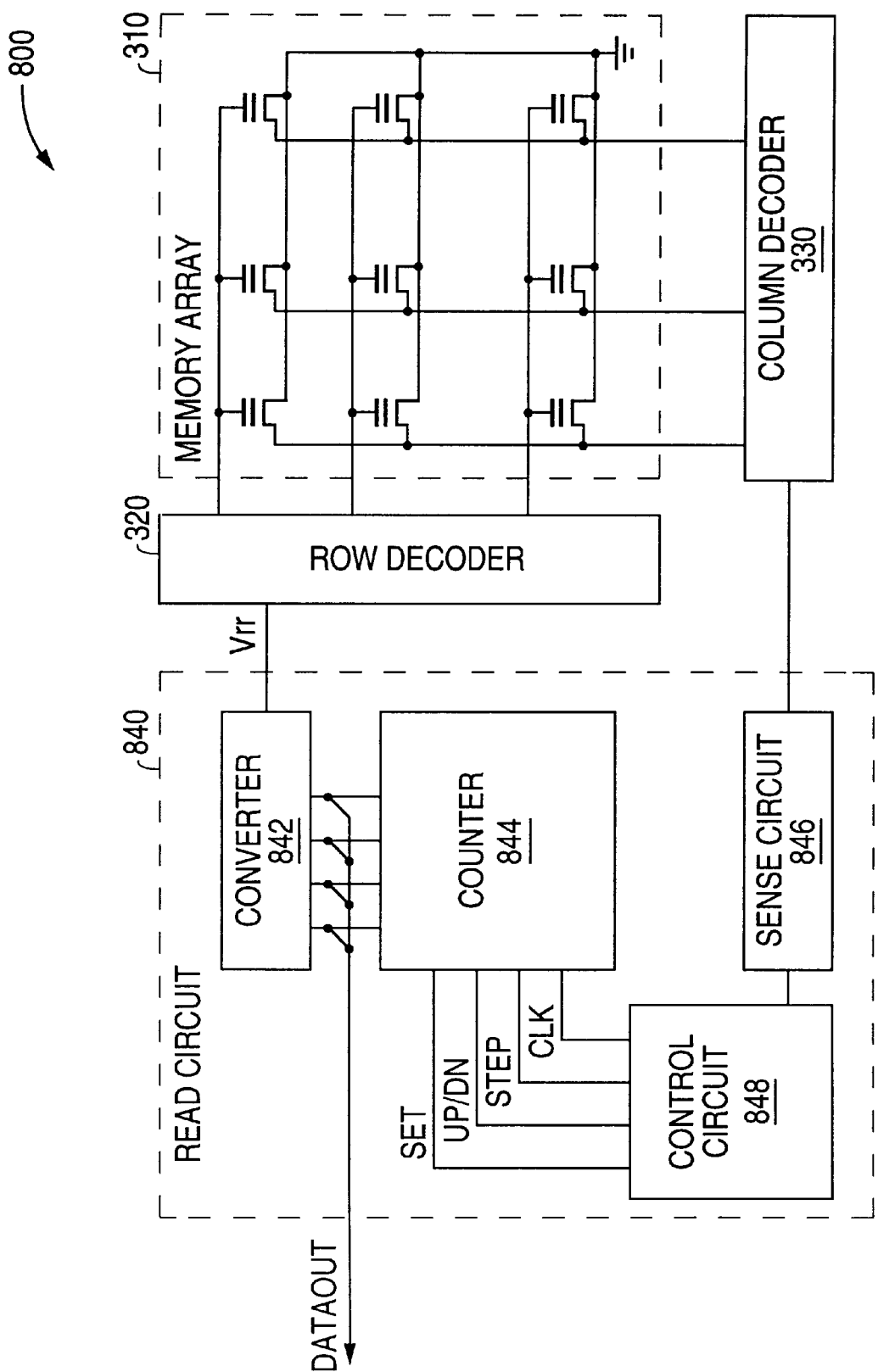
FIG. 8 shows a multi-level memory in accordance with an embodiment of the invention wherein a counter changes a control gate voltage as required for a search for a count corresponding to the threshold voltage of a memory cell being read.

Another way to reduce read access times is to reduce the number of times the count and signal Vrr must be changed before reaching the threshold voltage of the memory cell being read. FIG. 8 illustrates a memory 800 that changes the voltage level of read signal Vrr to perform a coarse-to-fine search for the threshold voltage (and therefore the stored multi-bit digital value) of a selected memory cell. Memory 800 includes a read circuit 840 that reads a single memory cell at a time. For a read operation, row decoder 320 and column decoder 330 connect read circuit 340 to a selected row line and a selected column line in a memory array 310. The memory cell selected for the read operation is coupled to the selected row and column lines. At the start of the read, converter 842 or a precharge circuit (not shown) charges the selected row line to the desired starting control gate voltage. The starting voltage of the search may be the lowest possible threshold voltage, the midpoint of the range of possible threshold voltages, the highest possible threshold voltage, or any other desired voltage in the range of threshold voltages representing data values. In read circuit 840, a control circuit 848 initially sets a counter 844 to a count corresponding to the starting voltage so that signal Vrr from converter 842 is initially at the desired starting voltage.

Figure 9B:
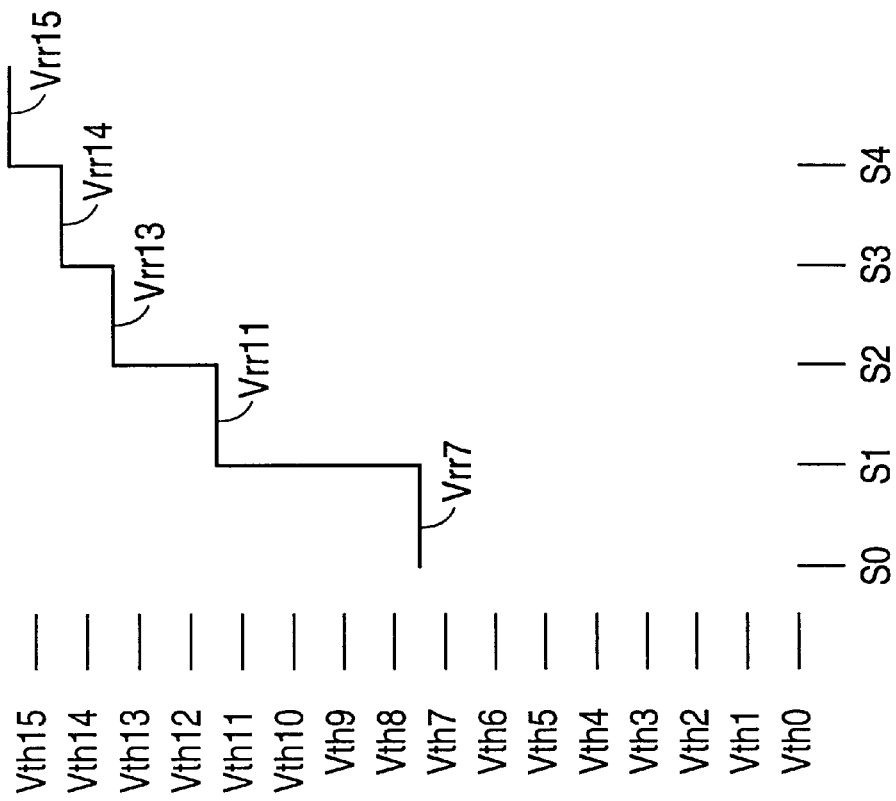
FIGS. 9A and 9B illustrate read processes for the multi-level memory of FIG. 8.
Figure 9A:
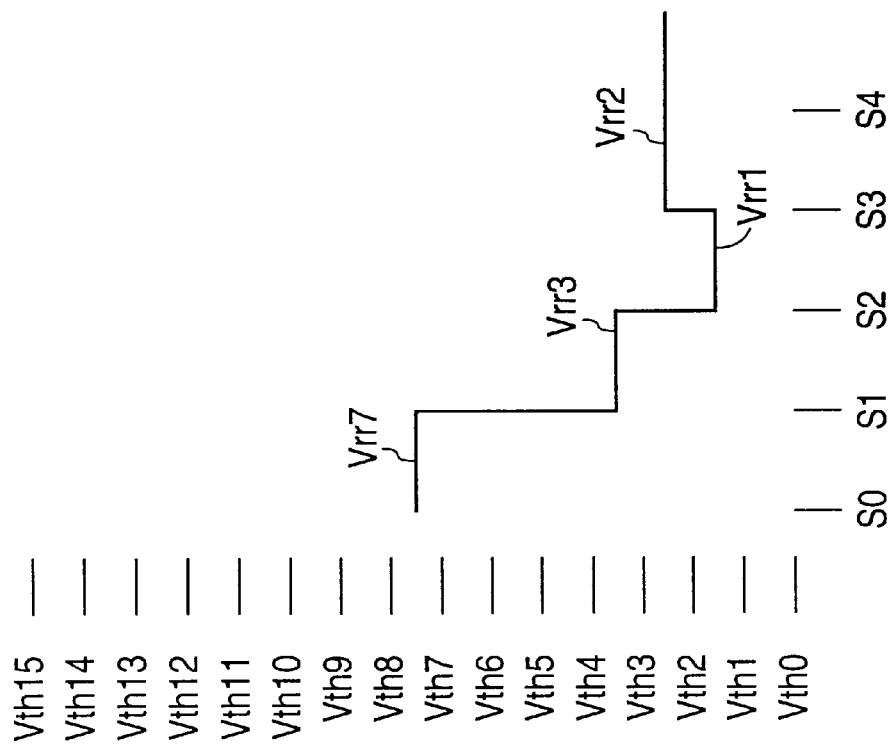

FIGS. 9A and 9B illustrate read processes where the starting control gate voltage corresponds to the midpoint of the range of count for counter 844. For memory 800, where each memory cell stores a 4-bit value and counter 844 is a 4-bit count, the starting control gate voltage is a voltage Vrr7 which is voltage corresponding to count of seven. In FIGS. 9A and 9B, voltages Vth0 to Vth15 are target threshold voltages corresponding to data values zero to fifteen. The actual threshold voltage values represent data values are in a window containing the target threshold voltage. During the read process, the possible steady state voltage levels for signal Vrr are voltages Vrr0 to Vrr15, which respectively correspond to counts zero to fifteen and are greater than highest threshold voltages representing respective data values zero to fifteen.

Counter 842 is an up/down counter having a variable step size for each increase or decrease in the count. Control circuit 848 selects a direction (up or down) for counting in counter 844 according to whether the selected memory cell conducts during the current counter clock cycle. If the selected memory cell conducts, control circuit 840 selects counting down, i.e., the counting direction which reduces the voltage of signal Vrr. If the selected memory cell does not conduct, control circuit 840 selects counting up, i.e., the counting direction which increases the voltage of signal Vrr. Sense circuit 846 generates the signal which informs control circuit 848 whether the selected memory cell conducts. More specifically, column decoder 330 connects sense circuit 846 to the selected column line and biases the selected column line at read voltage Vrc. Sense circuit 846 then senses current or voltage on the selected column line to identify whether the selected memory cell conducts. For a coarse-to-fine search, control circuit 840 initially sets the step size for counter 844 to a largest step (typically one quarter the range of counter 844) and decreases the step size (typically by half) for each stage except a last stage for the read operation. Each stage requires single clock cycle. In the last stage, the step size is either 0 or 1 depending on whether the selected memory cell conducts or not.

FIG. 9A is described in conjunction with FIG. 8 to illustrate a read process where the data value stored in the selected memory cell is 2. To initiate the read, control circuit sets the count in counter 844 to seven and the step size to four. Row decoder 320 applies signal Vrr from converter 842 to the selected row line. Initially, signal Vrr is at voltage Vrr7. The data value in the selected memory cell is two, and the threshold voltage of the selected cell is about equal to target voltage Vth2 which is less than voltage Vrr7. Accordingly, sense circuit 846 senses that the selected memory cell conducts during an initial stage S0. In response, control circuit 848 selects down for the count direction for the next clock cycle.

Upon clocking of counter 844, counter 844 decreases the count to three, and the read process reaches stage S1. Converter 842 changes (specifically lowers) signal Vrr to voltage Vrr3, and sense circuit 846 senses that the selected memory cell still conducts. Control circuit 848 halves the step size and in response to sense circuit 846 indicating the selected memory cell conducts, sets counting direction to down. Control circuit 848 then clocks counter 844, and the read process moves to stage S2.

Upon the second clocking of counter 844, counter 844 decreases the count to one causing converter 842 to change (specifically lower) signal Vrr to voltage Vrr1. Sense circuit 846 senses that the selected memory cell no longer conducts. Control circuit 848 halves the step size to one and in response to sense circuit 846 indicating the selected memory cell does not conduct, sets counting direction to up. Control circuit 848 then clocks counter 844, and the read process moves to the last stage S3.

Upon the third clocking of counter 844, counter 844 increases the count to two causing converter 842 to change (specifically increase) signal Vrr to voltage Vrr2. Sense circuit 846 senses that the selected memory cell again conducts. Accordingly, control circuit 848 set the counting direction to down. During this last stage, control circuit 848 selects a step size according to whether the selected memory cell conducts. If the selected cell conducts in stage S3, control circuit 848 sets the step size to zero. Otherwise, the step size remains one. In read process of FIG. 9A, signal Vrr is at voltage Vrr2 in stage S3 and the selected cell conducts. Accordingly, the step size for stage S3 of FIG. 9A is zero.

At time S4, control circuit 848 clocks counter 844, and counter 844 outputs the count (two) as data value read.

For the read process of FIG. 9B, the data value stored in the selected memory cell is fifteen. In stage S0, signal Vrr is at voltage Vrr7, and the selected memory cell does not conduct. Accordingly, the count is increased by four (the step size for stage S0) at the end of stage S0 to eleven for stage S1. In stage S1, signal Vrr is at voltage Vrr11, and the selected memory cell still does not conduct. Accordingly, the count is increased by two (the step size for stage S1) at the end of stage S1 to thirteen for stage S2. In stage S2, signal Vrr is at voltage Vrr13, and the selected memory cell still does not conduct. Accordingly, the count is increased by one (the step size for stage S2) to fourteen for stage S3. In last stage S3, signal Vrr is at voltage Vrr14, and the selected memory cell still does not conduct. Since the selected cell does not conduct in stage S3, the step size remains one, and counter 844 increments the count to fifteen before outputting the count (fifteen) as the data value read.

Memory 800 of reads a 4-bit value from a single memory cell in about four clock cycles. More generally, if each memory cell stores N bits of data, the read process for reading a single memory cell in memory 800 requires about N clock cycles. If a read operation is required to provide more data than can be held in a single memory, the read operation can serially read data first from one memory cell then from another from memory cells in the same memory array, or in parallel if memory includes multiple arrays with multiple read circuits. Multiple arrays are required for parallel read operations because signal Vrr changes in a manner that specifically depends on the value being read, and distinct signals Vrr, which do not interfere with each other, are required for each selected memory cell. Parallel read operation require N clock cycles the same as a single read. However, serial read operations in a single array architecture read M memory cells in about M·N clock cycles. In comparison, in the worst case, memory 600 requires about $2^N$ clock cycles to read from a memory cell, but the architecture of memory 600 can read any number M of memory cells in parallel, in $2^N$ clock cycles. Accordingly, parallel reads using the architecture of memory 800 substantially decrease read access times when compared to other read methods. Whether a read operation in the memory architecture of memory 600 or serial reads using the memory architecture of memory 800 requires fewer clock cycles to complete depends on the number N of bits per cell and the number M of cells that must be accessed per read operation.

Although the invention has been described with reference to particular embodiments, the description is only an example of the invention's application and should not be taken as a limitation. In particular, even though much of the preceding discussion was aimed at memory cells that operate with threshold voltages that increase with higher data values, alternative embodiments of this invention include memory cells where lower threshold voltages represent higher data values. Additionally, embodiments of the invention include memories where each memory cell has three or more possible values and is not limited to cases where the number of possible data values that can be stored in a memory cell is a power of two. Various other adaptations and combinations of features of the embodiments disclosed are within the scope of the invention as defined by the following claims.

I claim:

1. A multi-level memory comprising:

an array of memory cells;

a driver that generates a first signal having a voltage that changes during a read operation, wherein during the read operation the driver is connected to a selected memory cell in the array and applies the first signal to the selected memory cell;

a counter containing a count, wherein the counter changes the count during a read while the driver changes the first signal, the counter generating a second signal representing the count; and an output circuit that receives the second signal and provides a third signal representing a multi-bit digital value read from the array, the multi-bit digital value being derived from the second signal.

2. The memory of claim 1, further comprising a sense circuit that is connected to the selected memory cell during a read operation and generates a fourth signal for identifying when the selected memory cell changes conductivity, wherein the output circuit uses second and fourth signal in generating the third signal.

3. The memory of claim 2, wherein the array comprises row lines and column lines, each row line being coupled to control gates of memory cells in a row of the array, each column line being coupled to memory cells in a column of the array; and the memory further comprises a decode circuit that connects the driver to a row line and connects the sense circuit to a column line.

4. The memory of claim 2, wherein the output circuit comprises a latch coupled to latch the second signal in response to the fourth signal indicating that the selected memory cell changed conductivity.

5. The memory of claim 1, wherein during the read operation, the driver linearly ramps the read signal while the counter counts.

6. The memory of claim 1, wherein the driver comprises a converter coupled to the counter.

7. The memory of claim 6, further comprising a multiplexer and a data port for input of a data value to be written in the memory, wherein:

during the read operation, the multiplexer selects and applies the third signal from the counter to the converter, and the third signal controls a voltage level of the first signal; and during a write operation, the driver is connected to apply the first signal to a memory cell in the array, the multiplexer selects and applies to the converter a fourth signal that represents the data value to be written, and the fourth signal controls a voltage level of the first signal.

8. The memory of claim 1, wherein the output circuit comprises a shift register coupled to record the second signal each time the counter changes the count.

9. The memory of claim 1, wherein the output circuit comprises a bus that provides at least a portion of the second signal as the third signal.

10. The memory of claim 9, wherein:

the second and third signals are multibit digital signals with the second signal including more bits than does the third signal; and the bus provides most significant bits of second signal as the third signal.

11. A multi-level memory comprising:

an array of memory cells including row lines and column lines, each row line being coupled to control gates of memory cells in a row of the array, each column line being coupled to memory cells in a column of the array;

a counter;

a converter that generates a read signal having a voltage that depends on a count signal from the counter;

an output circuit that receives the count signal and provides a data signal that represents a multi-bit digital value read from the array;

a sense circuit that generates a sense signal for identifying when the count signal corresponds to the multi-bit digital value; and a decode circuit that connects the converter to a row line and connects the sense circuit to a column line.

12. The memory of claim 11, wherein a clock signal applied to the counter during a read operation causes the counter to change the count signal.

13. The memory of claim 12, wherein the output circuit comprises a latch coupled to the sense circuit and the counter, wherein in response to the sense circuit sensing a change in conductivity of a memory cell on the column line connected to the sense circuit, the sense circuit asserts the sense signal which causes the latch to latch a value of the count signal.

14. The memory of claim 13, further comprising a second sense circuit which the decode circuit connects to a second column line, wherein the output circuit further comprises a second latch coupled to the second sense circuit and the counter, wherein in response to the second sense circuit sensing a change in conductivity of a memory cell on the second column line, the second sense circuit asserts a signal that causes the second latch to latch a value of the count signal.

15. The memory of claim 12, further comprising a control circuit coupled to the counter and the sense circuit, wherein:

the counter is an up/down counter;

for each cycle of the clock signal, the control circuit selects a counting direction for the counter; and the counting direction selected by the control circuit for a clock cycle depends whether the sense circuit senses a conductive memory cell.

16. The memory of claim 15, wherein the counter has a variable step size for counting, and for each clock cycle of the clock signal, the control circuit selects a step size for the counter.

17. The memory of claim 12, wherein the output circuit comprises a shift register coupled the counter, wherein each clock cycle, a count from the counter shifts into the shift register and the shift register shifts count values that are in the shift register, and in response to the sense circuit sensing a change in conductivity of a memory cell on the column line connected to the sense circuit, the sense circuit asserts the sense signal which causes output of one of a plurality of count values from the shift register.

18. The memory of claim 11, wherein in response to the sense circuit sensing a change in the conductivity of a memory cell on the column line connected to the sense circuit, the sense circuit asserts the sense signal to stop the counter from changing the count signal.

19. The memory of claim 11, further comprising a control circuit that sets a count in the counter to an initial value at a start of the read operation.

20. The memory of claim 11, further comprising:

a data port for input of a digital data signal representing a multi-bit value to be written to a memory cell in the array; and a multiplexer that connects the counter to the converter during a read operation and connects the data port to the converter during a write.

21. The memory of claim 11, wherein:

the converter applies the read signal through the decode circuit to the row line during the read; and the sense circuit, when connected by the decode circuit to the column line, senses a conductivity state of a memory cell coupled to the row line and the column line.

22. A method for reading a data value from a memory, comprising:

applying a read signal to a selected row line in a memory array, the selected row line being connected to control gates of memory cells in a row of the array;

changing a voltage of the read signal while counting clock cycles with a counter;

sensing conductivity of a first memory cell that is on the selected row line and on a first selected column line in the memory array; and generating an output data signal from a value that a count in the counter has when the first memory cell changes conductivity.

23. The method of claim 22, further comprising shifting counts from the counter into a shift register, wherein generating the output data signal comprises selecting one of a plurality of counts that are in the shift register as the output data signal.

24. The method of claim 23, wherein selecting one of a plurality of counts that are in the shift register comprises selecting a count according to a time interval between the first memory cell changing conductivity and sensing of the changing conductivity.

25. A method for reading a data value from a memory, comprising:

applying an output signal of a converter to a selected row line in a memory array, the selected row line being connected to control gates of memory cells in a row of the array;

applying a count signal from a counter to the converter, wherein the count signal controls a voltage of the output signal;

applying a clock signal to the counter to change the count signal;

sensing conductivity of a first memory cell on the selected row line and a first selected column line in the memory array; and generating an output data signal from the count signal.

26. The method of claim 25, wherein generating the output data signal comprises setting a multi-bit portion of the output data signal to represent bits from a count that the count signal represented when a change in conductivity was sensed.

27. The method of claim 26, further comprising sensing a change in conductivity of a second memory cell on a second selected column line in the memory array; wherein generating the output data signal further comprises setting a second multi-bit portion of the output data signal to represent bits from a count that the count signal represented when the change in conductivity of the second memory cell was sensed.

28. The method of claim 27, wherein:

applying the clock signal to the counter starts with the count signal representing an initial count, continues while the count signal sequentially represents values between the initial count and a final count, and ends when the count signal represents the final count; and sensing the change in the conductivity of the first memory cell and sensing the change in the conductivity in the second memory cell occur while applying the clock signal.

29. The method of claim 28, wherein a difference between the initial count and the final count is determined before starting to apply the clock signal.

30. The method of claim 28, further comprising determining the final count after sensing the change in the conductivity of the first memory cell and sensing the change in the conductivity in the second memory cell.

31. The method of claim 25, further comprising selecting during each cycle of the clock signal whether the counter changes the count signal to increase, decrease, or maintain the voltage level of the output signal from the converter.

32. The method of claim 31, wherein a selection of whether to increase, decrease, or maintain the voltage level of the output signal from the converter depends on the conductivity sensed.

33. The method of claim 31, further comprising selecting a step size for the counter during each clock cycle.

34. The method of claim 33, wherein selecting the step size comprises reducing a step size for a clock cycle, to half a step size for an immediately preceding clock cycle.

* * * * *